United States Patent
Jacot et al.

(10) Patent No.: US 7,148,610 B2
(45) Date of Patent: Dec. 12, 2006

(54) SURFACE ACOUSTIC WAVE DEVICE HAVING IMPROVED PERFORMANCE AND METHOD OF MAKING THE DEVICE

(75) Inventors: Philippe Jacot, St-Aubin (CH); Philippe Krebs, Neuchatel (CH); Christian Lambert, Le Landeron (CH)

(73) Assignee: OC Oerlikon Balzers AG, Balzers (LI)

( * ) Notice: Subject to any disclaimer, the term of this patent is extended or adjusted under 35 U.S.C. 154(b) by 48 days.

(21) Appl. No.: 10/061,550

(22) Filed: Feb. 1, 2002

(65) Prior Publication Data
US 2003/0146674 A1 Aug. 7, 2003

(51) Int. Cl.
*H01L 41/08* (2006.01)

(52) U.S. Cl. ............... 310/364; 310/313 A; 310/313 R

(58) Field of Classification Search ............ 310/313 A, 310/313 B, 313 R, 363, 364, 313 D; 333/150–153, 333/192–196
See application file for complete search history.

(56) References Cited

U.S. PATENT DOCUMENTS

| | | | |
|---|---|---|---|
| 4,472,652 A * | 9/1984 | Brice et al. ............. | 310/313 B |
| 4,686,111 A | 8/1987 | Cho | |
| 4,775,814 A * | 10/1988 | Yuhara et al. .......... | 310/313 R |
| 4,906,885 A | 3/1990 | Kojima et al. | |
| 5,039,957 A | 8/1991 | Greer et al. | |
| 5,144,185 A | 9/1992 | Yuhara et al. | |
| 5,152,864 A | 10/1992 | Ieki et al. | |
| 5,215,546 A | 6/1993 | Cho et al. | |
| 5,343,107 A | 8/1994 | Shikata et al. | |
| 5,468,595 A | 11/1995 | Livesay | |
| 5,497,726 A | 3/1996 | Shikata et al. | |
| 5,558,711 A | 9/1996 | Sakurai | |
| 5,773,917 A * | 6/1998 | Satoh et al. ................ | 310/364 |
| 5,774,962 A | 7/1998 | Satoh et al. | |
| 5,844,347 A * | 12/1998 | Takayama et al. ...... | 310/313 R |
| 5,909,156 A | 6/1999 | Nishihara et al. | |
| 5,923,231 A | 7/1999 | Ohkubo et al. | |
| 5,929,723 A | 7/1999 | Kimura et al. | |
| 6,154,105 A | 11/2000 | Fujimoto et al. | |
| 6,259,185 B1 * | 7/2001 | Lai ........................ | 310/313 B |

(Continued)

FOREIGN PATENT DOCUMENTS

EP 0762641 A 3/1997

(Continued)

OTHER PUBLICATIONS

Kim, Jin Yong and Kim, Hyeong Joon, "Passivation Layer Effects on Power Durability of SAW Duplexer", 1999 IEEE Ultrasonics Symposium, p. 39-42 (1999).

(Continued)

*Primary Examiner*—Mark Budd
(74) *Attorney, Agent, or Firm*—Pearne & Gordon LLP

(57) ABSTRACT

A surface acoustic wave device includes a transducer electrode formed on a substrate. In one aspect, the electrode has a plurality of layers. At least one of the layers is metal and another of the layers is a material for providing a hardening effect to the metal layer by reinforcement with $Al_2O_3$ precipitates. In another aspect, the electrode is electrically connected to a metal component that permits electrical connection of the surface acoustic wave device to an electrical device external to the surface acoustic wave device. The electrode has a metal portion of a first metallization. The component is of a second, different metallization. In other aspects, the surface acoustic wave device is made via a method to have such structural aspects.

31 Claims, 5 Drawing Sheets

U.S. PATENT DOCUMENTS

| | | | |
|---|---|---|---|
| 6,297,580 B1 * | 10/2001 | Takayama et al. | 310/364 |
| 6,377,138 B1 * | 4/2002 | Takagi et al. | 333/193 |
| 6,404,101 B1 * | 6/2002 | Taniguchi et al. | 310/313 A |
| 6,404,110 B1 * | 6/2002 | Nakashima et al. | 310/364 |
| 6,417,574 B1 * | 7/2002 | Misawa et al. | 257/778 |
| 6,486,591 B1 * | 11/2002 | Nishihara | 310/364 |
| 6,552,475 B1 * | 4/2003 | Hori et al. | 310/364 |
| 6,580,198 B1 * | 6/2003 | Nakano et al. | 310/313 R |
| 6,657,366 B1 * | 12/2003 | Watanabe et al. | 310/364 |
| 6,774,542 B1 * | 8/2004 | Anasako | 310/364 |
| 6,909,341 B1 * | 6/2005 | Takayama et al. | 333/193 |

FOREIGN PATENT DOCUMENTS

| | | |
|---|---|---|
| EP | 1089431 A | 4/2001 |
| WO | WO 00/33394 | 6/2000 |

OTHER PUBLICATIONS

Satoh, Yoshio and Ikata, Osamu, "Ladder Type Saw Filter and Its Application to High Power Saw Devices", International Journal of High Speed Electronics and Systems, vol. 10, No. 3, p. 825-865, (2000).

* cited by examiner

SURFACE ACOUSTIC WAVE DEVICE HAVING IMPROVED PERFORMANCE AND METHOD OF MAKING THE DEVICE

TECHNICAL FIELD

The present invention relates to surface acoustic wave (SAW) devices. Specifically, the present invention relates to SAW devices fabricated to have high-power metallization systems. In one particular application, the present invention relates to such high power SAW devices utilized as filters within antenna duplexers.

BACKGROUND OF THE INVENTION

A surface acoustic wave (SAW) device is an electromechanical conversion element that utilizes a surface wave propagating across a surface of body to convey energy between electrodes of an inter-digital transducer. When an electric signal is supplied to one of the electrodes, the body is stressed, and the stress becomes a surface acoustic wave. The wave propagates on the body and causes generation of an electric signal at the other transducer.

SAW devices are utilized in a wide range of applications. One example application is as a filter adapted for high energy transmission. Another example application is as a resonator in which a surface wave of large amplitude is present as a standing wave.

Current SAW devices may develop issues concerning hillocks, voids, or the like due to metal migration that takes place within aluminum metallized electrodes. The migration is due primarily to the induced stress. Such issues may readily occur for a SAW device that has very fine inter-digit fingers that provide the electrode transducer. Under such circumstances, the SAW device may experience deviation or shift away from desired frequency performance.

A SAW device that is utilized as an antenna duplexer (e.g., within a cellular handset) must be able to withstand a continuous wave with a high power input within a high frequency region. Specifically, the metallization of the inter-digit transducer, and also the metallization of the bond pads and busbars, must be able to withstand such use without undue degradation of performance.

Metallization systems for SAW amplifier duplexers have been developed for use within the 800–900 MHz frequency band. Also, some SAW antenna duplexer devices have been developed for the 1.8 to 2.1 GHz frequency band. In order to provide sufficient durability of such SAW antenna duplexers, there have been many attempts directed toward improvement. Specifically, the attempts have been directed toward improved power durability. Some of the efforts have been directed toward developing new compositions of aluminum alloy.

Generally, pure aluminum metal exhibits a poor antimigration property (i.e., subject to easy migration). Some of the previous work toward improvement has found that small amounts of dopant, such as Cu, Pd, Y, Sc, or Mg, have provided increased power durability. For small amounts of such dopant, device lifetime is increased. However, at a certain point, increases in the dopant amount causes an undesirable increase in electrical resistance. Thus, these related factors cause a balance between the increased lifetime and the increased electrical resistivity.

SUMMARY OF THE INVENTION

In accordance with one aspect, the present invention provides a surface acoustic wave device including a transducer electrode formed on a substrate. The electrode has a plurality of layers. At least one of the layers is metal and another of the layers is a material for providing a hardening effect to the metal layer.

In accordance with another aspect, the present invention provides a surface acoustic wave device that includes a transducer electrode formed on a substrate. The electrode has a plurality of layers. One of the layers is metal and another of the layers is a metal and oxygen compound.

In accordance with yet another aspect, the present invention provides a method of making a surface acoustic wave device. The method includes providing a substrate and creating a transducer electrode having a plurality of layers on the substrate. The step of creating the electrode includes creating a metal layer and creating a layer of a material that provides a hardening effect to the metal layer.

In accordance with still another aspect, the present invention provides a surface acoustic wave device that includes a transducer electrode. The electrode is electrically connected to a metal component that permits electrical connection of the surface acoustic wave device to an electrical device external to the surface acoustic wave device. The electrode has a metal portion of a first metallization. The component is of a second, different metallization.

In accordance with still another aspect, the present invention provides a surface acoustic wave device that includes a transducer electrode. The electrode is electrically connected to a component that permits electrical connection of the surface acoustic wave device to an electrical device external to the surface acoustic wave device. The electrode has a metal portion made of a first metal. The component is made of a second, different metal.

In accordance with yet still another aspect, the present invention provides a surface acoustic wave device that includes a transducer electrode. The electrode is electrically connected to a component that permits electrical connection of the surface acoustic wave device to an electrical device external to the surface acoustic wave device. The electrode has a metal portion of a first thickness. The component is a metal of a second, different thickness.

In accordance with yet still another aspect, the present invention provides a method of making a surface acoustic wave device. The method includes making a transducer electrode. The transducer electrode is made to have a metal portion of a first metallization. The method includes making a metal component, electrically connected to the electrode, that permits electrical connection of the surface acoustic wave device to an electrical device external to the surface acoustic wave device. The metal component is made of a second, different metallization.

BRIEF DESCRIPTION OF THE DRAWINGS

The foregoing and other features and advantages will become apparent to the person of ordinary skill in the art upon reading the following description with reference to the accompanying drawings, wherein.

DESCRIPTION OF EXAMPLE EMBODIMENTS

Figure 1:
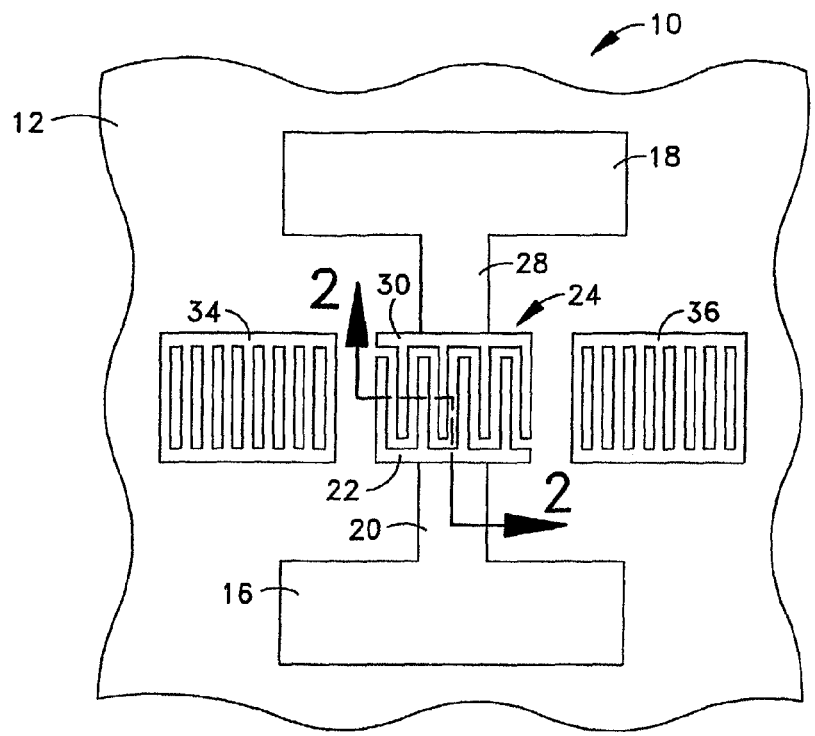
FIG. 1 is a plan view of a surface acoustic wave (SAW) device in accordance with the present invention.

One example of a surface acoustic wave (SAW) device 10 in accordance with the present invention is schematically shown in FIG. 1. The SAW device 10 is provided on a substrate 12. The substrate 12 is planar with a flat upper (as viewed in the Figures) surface. The substrate 12 may be of any suitable material such as quartz, lithium niobate, or lithium tantalate.

The SAW device 10 is usable in any application such as a filter. In one specific application, the SAW device is utilized as an antenna duplexer for use in a communication device such as a cellular telephone handset. Within the example device of a telephone handset, the SAW device is relatively small due in part to the compact nature of handsets.

In view of the relatively small size, the SAW device 10 includes two electrically conductive bond pads 16 and 18 for electrical connection of the SAW device to circuitry external to the SAW device. Extending from the first bond pad 16 is an electrically conductive busbar 20 that is electrically connected to a first set of electrode digits 22 of an inter-digital transducer (IDT) 24. An electrically conductive busbar 28 extends from the second bond pad 18 and is electrically connected to a second set of electrode digits 30 of the IDT 24. The first and second sets of electrode digits 22 and 30 extend in parallel relationship to each other in an interspersed fashion as is known in the SAW technology art. Also, the bond pads 16, 18, and the associated busbars 20, 28, are the components that permit electrical connection to the external circuitry as is known in the SAW technology art.

Adjacent to the IDT 24 are first and second reflectors 34 and 36. The reflectors 34 and 36 may have construction similar to the construction of the IDT 24. However, the IDT 24 has construction that is different from the construction of the bond pads 16, 18 and the associated busbars 20, 28.

Figure 2:
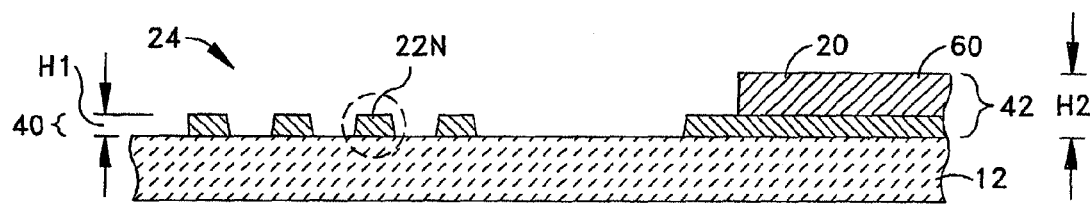
FIG. 2 is a cross-sectional view taken along line 2—2 of FIG. 1.

It is to be appreciated that the IDT 24 includes a metallization construction 40. Also, it is to be appreciated that the bond pads 16, 18, and busbars 20, 28 have a metallization construction 42. However, the metallization 40 of the IDT 24 is different from the metallization 42 of the bond pads and busbars 16, 18, 20, and 28. As seen in FIGS. 1 and 2, one example of a difference in the metallizations 40, 42 is illustrated. The different metallizations 40, 42 allow the IDT 24 to operate with desired parameters, and yet allow flow of electricity through the bond pads 16, 18 and busbars 20, 28 without undue restriction. Thus, in accordance with one aspect of the present invention and unlike known SAW devices, the IDT 24 is constructed with a different metallization 40 as compared to the metallization 42 of the bond pads 16, 18 and busbars 20, 28.

The difference in the two metallizations 40, 42 may be any difference that permits desired operation of the IDT 24 and also provides acceptable conductivity through the bond pads 16, 18 and the busbars 20, 28. In the example shown in FIGS. 1 and 2, the different metallizations 40, 42 include differences in size of metal layers for the IDT 24 and the bond pads 16, 18 and the busbars 20, 28. The difference may be accomplished by differences in height of the metal layers. Specifically, the metallization 40 has a height H1, and the metallization 42 has a height H2 that is greater than H1.

Figure 3:
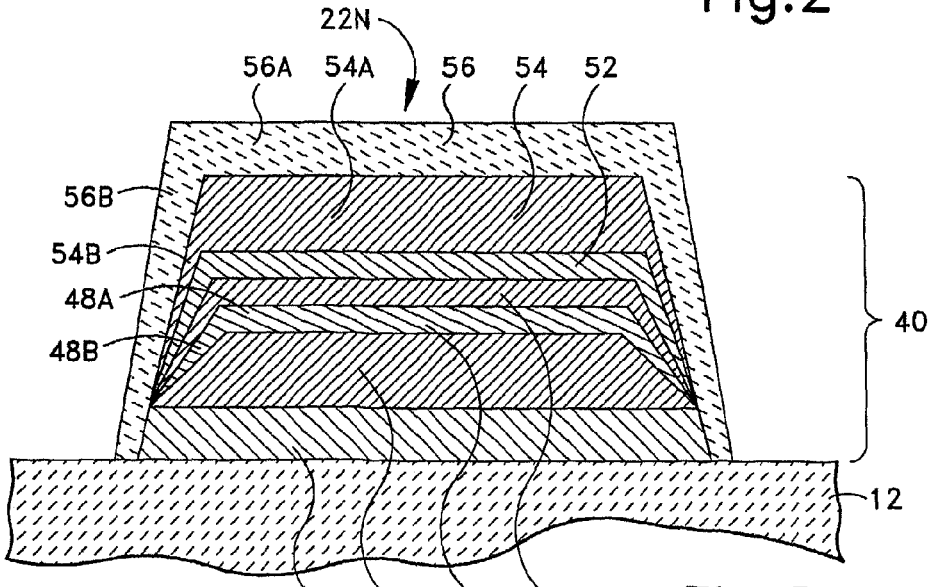
FIG. 3 is an enlarged view of a portion shown in FIG. 2.

FIG. 3 shows one example of the first metallization 40 that is utilized in the production of the inter-digital transducer 24. Specifically, a single electrode digit 22N of the first set of digits 22 is shown. The shown example metallization 40 includes a plurality of metal layers to provide a vertical stack. It is to be appreciated that the number of layers and the type of metal within the layers may be varied in accordance with the present invention.

Turning to the example, the metallization 40 includes a first layer 44 (i.e., a sublayer) that includes titanium or another metal and that is adhered to the substrate 12. On top of the sublayer 44 is a second layer 46 that includes aluminum or aluminum alloy, and aluminum oxide ($Al_2O_3$). The aluminum alloy may contain copper or magnesium and may form a solid solution (e.g. Al—Cu, Al—Mg). A next (i.e., third) layer 48 includes an intermetallic compound (e.g., $CuAl_2$, $MgAl_3$). This layer 48 is very thin and is formed by diffusion on the interface between the second layer 46 and the fourth layer 50. An intermediate (i.e., fourth) layer 50 includes a single metal such as copper or magnesium.

A fifth layer 52 includes an intermetallic compound. The compound may be the same intermetallic compound as the third layer (e.g., $CuAl_2$, $MgAl_3$). A sixth layer 54 includes aluminum or aluminum oxide ($Al_2O_3$). The solid solution may be the same as the second layer (e.g, Al—Cu, Al—Mg). Each of the plurality of layers 44–54 has at least a portion (e.g., 48A or 54A) that extends parallel to the planar surface of the substrate 12.

One of the issues that must be considered with any SAW device is the usable life that is provided by the inter-digital transducer. Specifically, during use, the digits of the inter-digital transducer are subjected to piezoelectric forces that may cause degradation of the digits. In particular, it is possible for aluminum to migrate.

Within the example shown in FIG. 3, the several layers of the first metallization are created such that at least some of the upper or subsequent layers (e.g., 48 or 54) have portions (e.g., 48B or 54B) that extend at least partially about lower or previous layers. These portions (e.g., 48B or 54B) extend transverse to the plane of the substrate 12. As such, these transverse portions (e.g., 48B or 54B) provide a lateral (e.g., sideways) stacking relative to the substrate 12. The lateral stacking extends about at least one layer (e.g., the second layer) that includes aluminum, alone or in a compound or combination. The lateral stacking improves the resistance to migration of aluminum within the IDT 24. In the illustrated example, layers 48–52 provide the lateral stacking.

A top or last (e.g., seventh) layer 56 is provided on an outermost periphery of the electrode digit 22N. The top layer 56 provides a passivation effect. The material of the top layer 56 may be silicon dioxide ($SiO_2$) or aluminum oxide ($Al_2O_3$). Similar to some (e.g., the upper layers 48–54) of the previous layers, the top layer 56 includes a portion 56A that extends parallel to the plane of the substrate 12 and a portion 56B that extend transversely to the plane of the substrate. The transverse portion 56B extends down along the sides of the electrode digit 22N to the substrate 12. As such, the transverse portion 56B may be considered to be part of the lateral stacking.

With the transverse portion 56B extending to the substrate 12, the top layer 56 encloses the previous metal layers 44–54 therein. However, it is to be noted that the material (e.g., $SIO_2$ or $Al_2O_3$) of the top layer 56 does not extend significantly along the substrate 12. Specifically, the material only extends down to engage the substrate 12 sufficiently to confine the metal layers 44–54 and thus define the electrode digit 22N.

Focusing specifically on the second layer 46, which contains aluminum or aluminum alloy, and aluminum oxide, it is again to be noted that pure metal aluminum has a poor antimigration property. Accordingly, another aspect of the present invention is the presence of aluminum oxide. Also, this aspect of the invention includes the utilization of oxygen during creation of the IDT 24 to provide the aluminum oxide within the second layer 46. Oxygen is permitted to interact with the aluminum to provide the aluminum oxide. In one example, the oxygen is provided via the presence of water (e.g., water vapor) during creation of the second layer 46 or via the presence of pure oxygen.

In one example, the aluminum oxide tends to have a greater concentration near the outer periphery surfaces (e.g., top, left, and right as shown in FIG. 3) of the second layer 46. The presence of aluminum oxide in the second layer 46 helps to inhibit migration of the aluminum metal. This is referred to as a hardening effect. With the aluminum oxide tending to be on the outer periphery of the second layer 46, it can be considered that the aluminum oxide creates yet another layer. This layer may be a film. Further, this layer may be considered a sublayer within the second layer 46 and as such is not specifically identified as a layer in the drawings, but could be considered to be represented by the outer periphery line of the second layer 46. Moreover, the transition of a pure metal (aluminum or aluminum alloy) to such an aluminum oxide sublayer may be a gradual, progressive transition. Nonetheless, the aluminum oxide can provide a hardening layer that provides the hardening effect to the aluminum and prevents migration of the aluminum.

It is to be appreciated that such a hardening layer or sublayer can be utilized in any of the upper, subsequent layers. For example, any of the layers (e.g., the third 48 or the fifth 52) that contains aluminum or a compound metal with aluminum as a component can be hardened via the introduction of oxygen to create a metal oxide within that layer. This includes the top or outermost layer 56 that is identified as the passivation layer. Thus, any of the layers can provide the hardening effect to aluminum metal and prevent migration.

It is to be understood that the construction of the electrode digit 22N shown in FIG. 3 may be modified to include different metals and alloys, different layers, different numbers of layers, different constructions with regard to lateral stacking and hardening layers, all within the scope of the present invention. For example, the metallization 40 of the electrode digit 22N may include a single layer of metal that is aluminum or aluminum alloy with the presence of aluminum oxide ($Al_2O_3$). Such a metallization does not rely upon lateral stacking for the improved antimigration properties. The hardening effect provides for the improved antimigration properties.

Still another example of the metallization 40 includes alternating layers of aluminum or aluminum alloy, and aluminum oxide ($Al_2O_3$). Such a metallization may have five layers, with an aluminum or aluminum alloy layer being the first layer. Lateral stacking can be utilized for such a plurality of layers.

A third example of the metallization 40 is alternating layers of aluminum or aluminum alloy, and aluminum or aluminum alloy with aluminum oxide sublayers. Again, the sublayers do not have clear definition boundaries between the metal (aluminum or aluminum alloy) and the aluminum oxide, but rather a progressive transition between the two. Such a metallization may have five layers, with an aluminum or aluminum alloy layer being the first layer. Lateral stacking can be utilized for such a plurality of layers. As yet another example of the metallization 40, alternating layers of aluminum or aluminum alloy, with aluminum oxide, are provided with the other layers being copper or magnesium. Such a metallization may have five layers, with an aluminum or aluminum alloy layer being the first layer. Lateral stacking can be utilized for such a plurality of layers. Again, the hardening effect improves the antimigration properties.

In view of the discussion so far, it is to be appreciated that the present invention provides various features and aspects that are directed to improvements in the performance and life of the IDT 24. Still other features and aspects that are directed to improvements in the performance and life of the IDT 24 are provided by the present invention.

As mentioned, the bond pad 16 (FIG. 2) and the busbar 20 has a different metallization 42 compared to the metallization 40 of the IDT 24. It is to be appreciated that although aluminum or aluminum alloy is a usefull metal within the IDT 24, aluminum and aluminum alloys do not have superior conductivity. As such, another aspect of the present invention provides for the avoidance of relying solely upon aluminum or aluminum alloy within the bond pads 16, 18 and the busbars 20, 28. In the example shown in FIG. 2, the metallization 42 of the bond pads 16, 18, and the busbars 20, 28 includes a silver layer 60 in addition to the metal layers of the first metallization 40. Of course it is to be appreciated that the metallization 42 may have a different construction (e.g., not including the metal layers of the first metallization 40 and possibly being just gold or other highly conductive metal). As an indication of the benefits provided by the use of different metallizations 40 and 42, the following chart provides a few examples:

| IDT metal system | PAD/BUSBAR | $R_{IDT}$ (Ohm) | $R_{TOT}$ (Ohm) | $R_{IDT}/R_{TOT}$ |
| --- | --- | --- | --- | --- |
| Al | Al | 1.19 | 9.75 | 12.2% |
| Al:2%Cu—Cu—Al:2%Cu | Al:2%Cu—Cu—Al:2%Cu | 2.19 | 18 | 12.2% |
| Al | Ag-2 μm | 1.17 | 1.67 | 70% |
| Al:2%Cu—Cu—Al:2%Cu | Ag-2 μm | 2.19 | 2.67 | 82% | wherein, $R_{IDT}$ is the resistance provided solely by the IDT 24, and $R_{TOT}$ is the resistance of the entire SAW device 10.

The SAW device 10 in accordance with the present invention may be made by any suitable technique. Certain techniques may more readily provide some of the construction features of the present invention. In particular, metal lift-off fabrication techniques more readily provide for some of the structural features of the present invention. The advantage of metal lift-off techniques may thus provide the present invention better than other techniques such as dry etching. However, it is to be appreciated that metal lift-off fabrication techniques are not intended as a limitation on the structural features of the present invention. As such, the structural features of the present invention may be made by any suitable technique.

Figure 4:
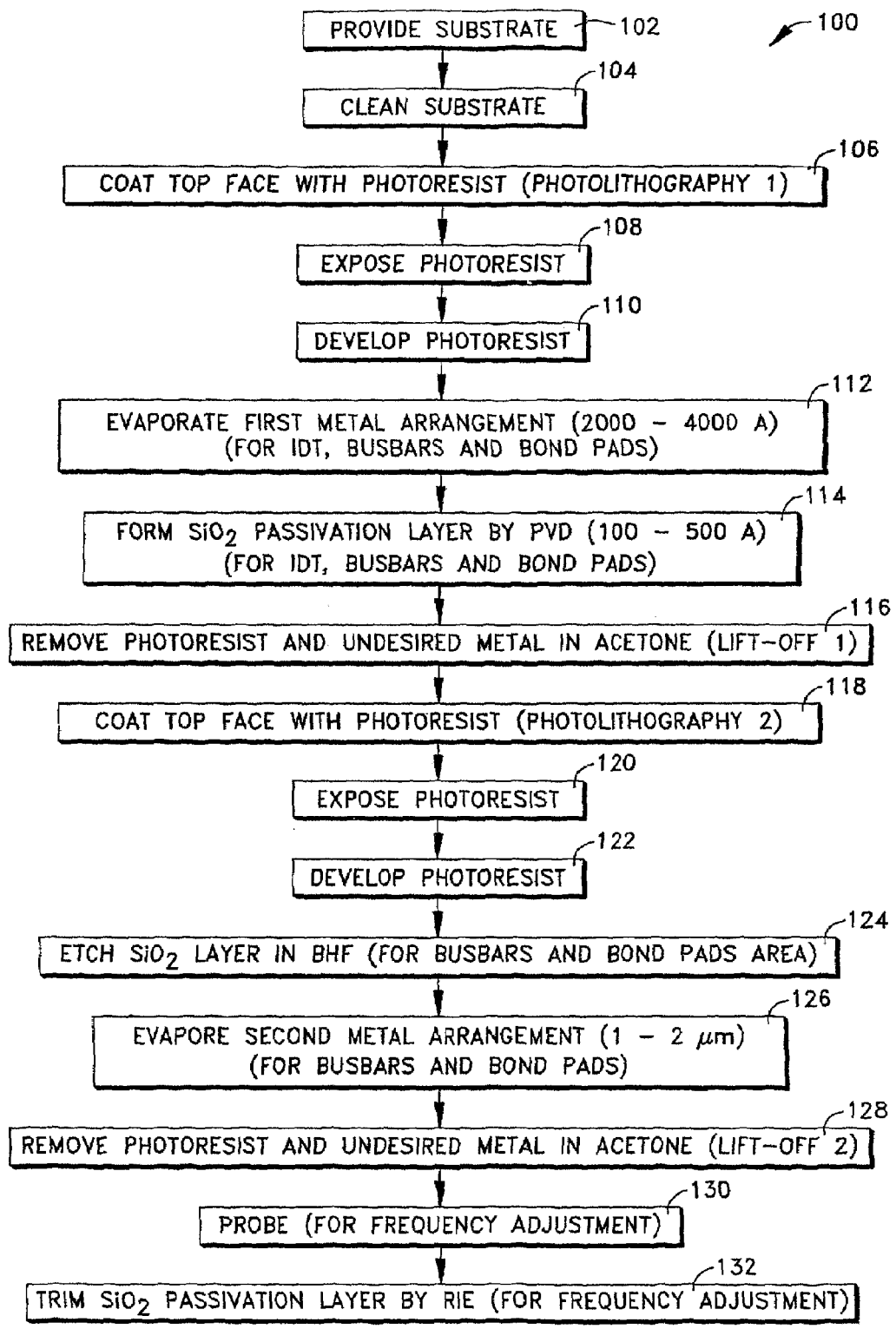
FIG. 4 is a flow chart for a process of making a SAW device in accordance with the present invention.

The flow chart of FIG. 4 illustrates one example process 100 in accordance with the present invention. The example includes metal lift-off techniques. At step 102, the substrate 12 is provided. The substrate 12 is chemically cleaned at step 104.

At step 106, the top or front surface of the substrate 12 is coated with a photoresist material. The coating is in preparation for a first lithography processing sequence for creation of the IDT 24. At step 108, the photoresist material is exposed utilizing a first mask. The mask is configured for production of the IDT 24. The mask may also include regions utilized to produce the first and second reflectors 34 and 36. Still further, the mask may also include regions utilized to produce the bond pads 16, 18 and the busbars 20, 28. The photoresist material is developed at step 110. The developing removes the photoresist material at the locations for the IDT 24, and if desired, the first and second reflectors 34 and 36, and the bond pads 16, 18 and the busbars 20, 28.

At step 112, the first metallization arrangement (e.g., for metallization 40) is provided onto the developed photoresist (i.e., with pertinent areas of the photoresist removed). In one example, the provision is via evaporation deposition of the metal material(s). The first metallization arrangement may have any of the above-mentioned constructions with regard to one or more layers (e.g., 46–54) and different materials. In one example, the first metallization arrangement is 2000 to 4000 angstroms thick.

Again, in the illustrated example, the first metallization arrangement goes toward providing the IDT 24 and a first part of the bond pads 16, 18 and the busbars 20, 28. Within step 112, the formation of one or more aluminum oxide sublayers or films occurs via the introduction of water vapor or pure oxygen during evaporation of aluminum or aluminum alloy.

At step 114, the silicon dioxide layer ($SiO_2$) or aluminum oxide layer ($Al_2O_3$) top, passivation layer 56 is created. In one example, the top, passivation layer 56 may be created via physical vapor deposition (PVD) and also may be 100 to 500 angstroms thick. Further, in the presented example, the top layer 56 is provided at the areas for the IDT 24, and at least initially for the bond pads 16, 18 and the busbars 20, 28.

At step 116, the developed photoresist material is removed via the use of acetone or the like. The undesired metal that is present upon the photoresist material and not adhered to the substrate 12 is removed with the removed photoresist material. This step 116 is referred to as a first lift-off step.

Again, the upper face of the substrate 12, with the first metallization arrangement and the top layer 56 in place, is coated with a photoresist material at step 118. Step 118 begins a second photolithography processing sequence. At step 120, the photoresist material is exposed utilizing another mask. The mask is such that exposure is used to provide areas for the bond pads 16, 18 and the busbars 20, 28. At step 122, the photoresist material is developed. Accordingly, the photoresist material at the areas of the bond pads 16, 18 and the busbars 20, 28 is removed to expose the silicon dioxide layer or aluminum oxide layer at the areas for creation of the bond pads and busbars.

At step 124, the silicon dioxide layer is etched away at the areas for the bond pads 16, 18 and the busbars 20, 28. Accordingly, in the provided example, the first metallization arrangement (e.g., the first metallization 40) is exposed at the areas for the bond pads 16, 18 and the busbars 20, 28. At step 126, a second metallization arrangement is deposited onto the exposed face. In one example, the second metallization arrangement provides material at a thickness of 1 to 2 micrometers. The second metal arrangement in conjunction with the first metal arrangement at the areas of the bond pads 16, 18 and the busbars 20, 28 provide the second metallization 42 that comprise the bond pads and busbars.

At step 128, the photoresist material is removed along with any metal upon the photoresist material (i.e., metal not at the areas for the bond pads and busbars). The removal of the photoresist material is via acetone or the like and can be referred to as a second lift-off. At step 130, the SAW device 10 is tested via a probe for determining frequency and needed frequency adjustment. At step 132, the silicon dioxide top layer or aluminum oxide top layer 56 can be trimmed via reactive ion etching or ion milling to make any adjustments needed for ensuring that the SAW device operates at a desired frequency.

FIGS. 5–18 provide visual illustration of the process 100 of FIG. 4. It is to be appreciated that FIGS. 5–18 may not truly represent a cross-section of the SAW device 10 of FIG. 1. FIGS. 5–18 are provided merely to show the different construction techniques utilized to create the IDT 24 and the bond pads 16, 18 and the busbars 20, 28.

Figure 5:
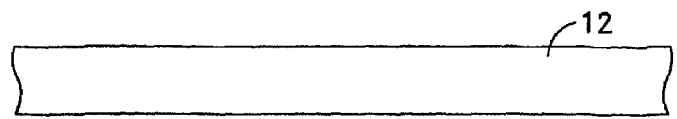
FIGS. 5–18 are sequential illustrations during the manufacture of a SAW device in accordance with the present invention.
Figure 6:
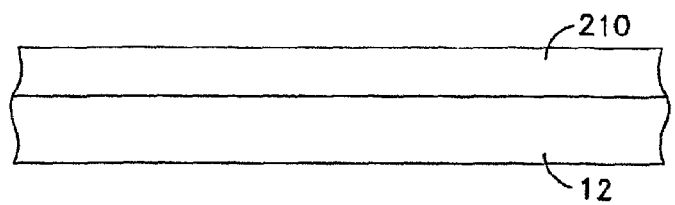
Figure 7:
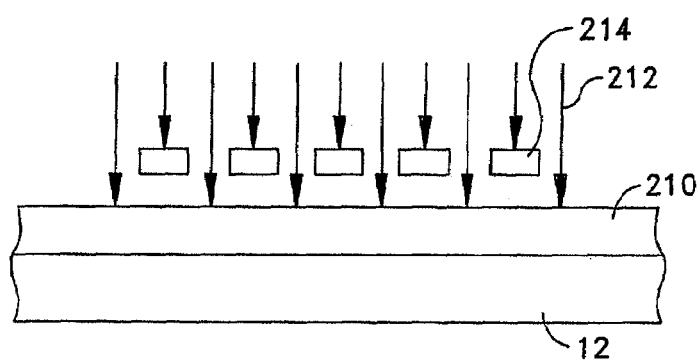

FIG. 5 shows the substrate 12 provided at step 102. FIG. 6 illustrates the coating of photoresist material 210 provided at step 106. The exposure (e.g., via applied energy 212 and a mask 214) of the photoresist material 210 at step 108 is illustrated within FIG. 7.

Figure 8:
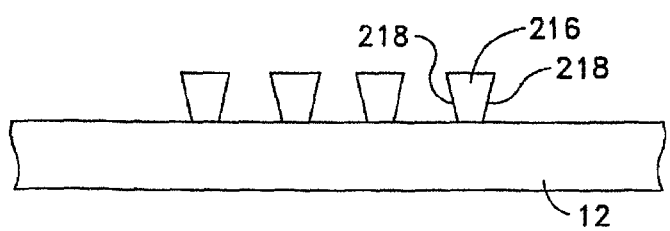

FIG. 8 illustrates the remaining photoresist material 216 as per step 110. It should be noted that the remaining photoresist material 216 has a slightly inverted taper 218 (i.e., taper inward toward the bottom). This taper 218 may aid in the production of the lateral stacking within the first metallization 40 used within the IDT 24. Again, although such a processing sequence is useful in the creation of the IDT 24 of the present invention, the IDT of the present invention may be created by other means.

Figure 9:
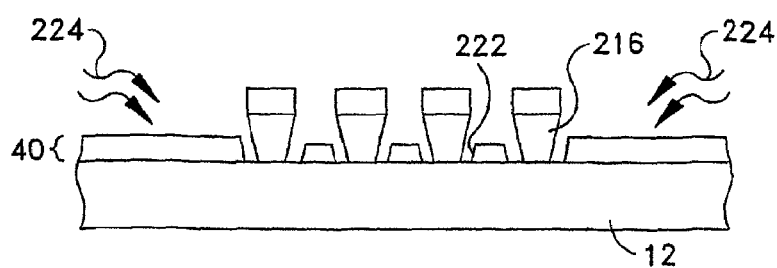

FIG. 9 illustrates the depositing (e.g., via evaporation) of the first metallization arrangement for the first metallization 40. As shown in FIG. 9, the first metallization arrangement includes the sloped or tapering surfaces 222 that aid in provision of the lateral stacking at the IDT 24. Note that metal can be deposited upon the remaining photoresist material 216. Also, it is to be noted that oxygen, possibly via water vapor or pure oxygen 224, is introduced during deposition of one or more aluminum/aluminum alloy layers.

Figure 10:
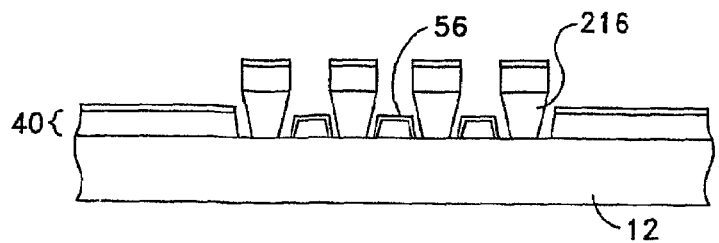
Figure 11:
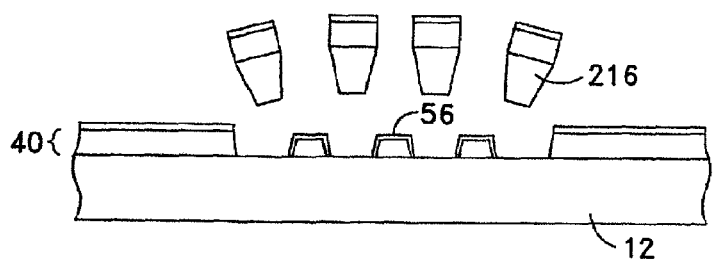
Figure 12:
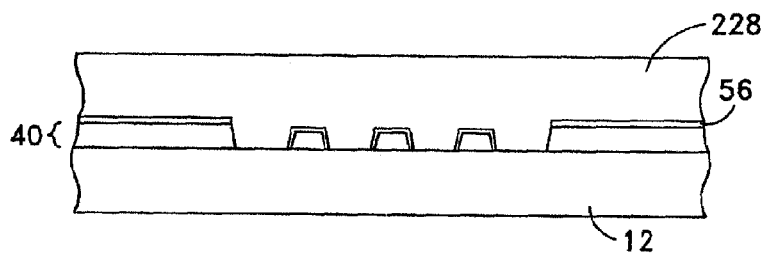

The formation of the silicon dioxide or aluminum oxide top layer 56 is shown in FIG. 10. The removal of the remaining photoresist material 216 at step 116 is schematically shown in FIG. 12.

Figure 13:
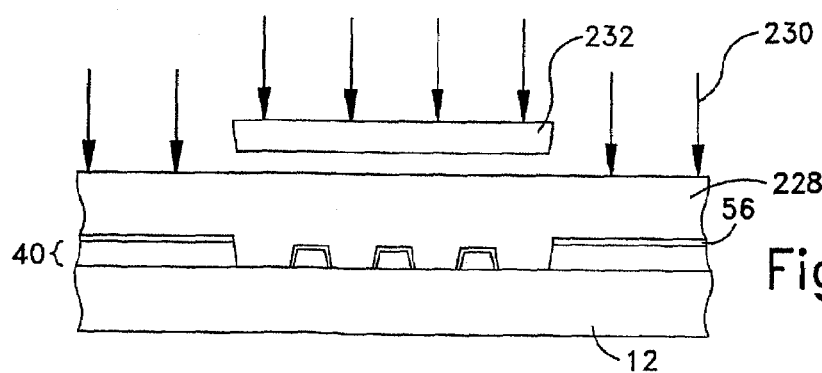
Figure 14:
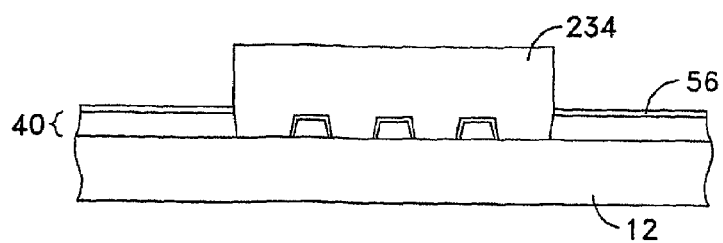

FIG. 13 shows the exposure (e.g., via applied energy 230 and a mask 232) of the photoresist material 228 for step 120. Note that the mask 232 permits exposure of the photoresist material 228 in areas for the bond pads 16, 18 and the busbars 20, 28. The developing of photoresist material at step 122 is shown in FIG. 14. As can be seen in FIG. 14, the remaining photoresist material 234 is removed from the areas for the bond pads 16, 18 and busbars 20, 28. Note that the remaining photoresist material 234 temporarily covers the area of the IDT 24.

Figure 15:
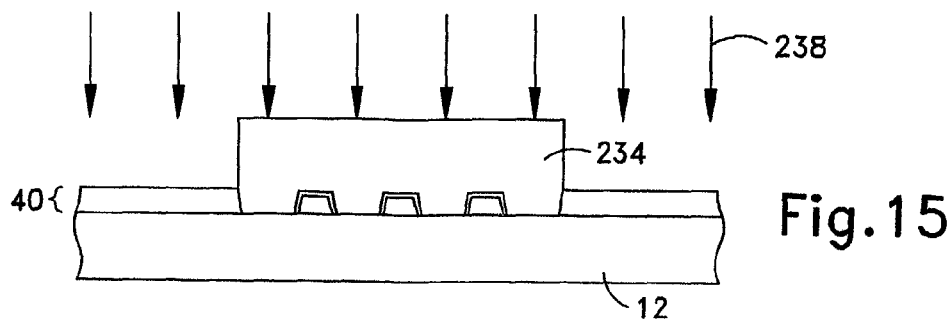
Figure 16:
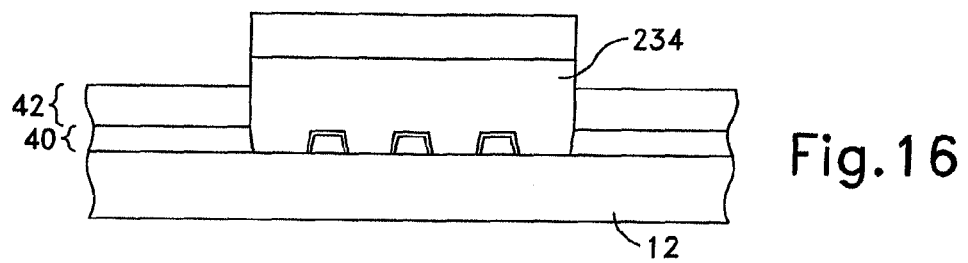

The etching of silicon dioxide or aluminum oxide of the top layer 56 at step 124 is shown in FIG. 15. The etching is via applied reactive ions 238 or wet process. The depositing of the second metal arrangement of step 126 is shown in FIG. 16. As can be seen in FIG. 16, the second metal arrangement is applied directly to the first metal arrangement at the areas of the bond pads 16, 18 and busbars 20, 28. Accordingly, the first and second metal arrangements together comprise the second metallization 42 that provides the bond pads 16, 18 and busbars 20, 28.

Figure 17:
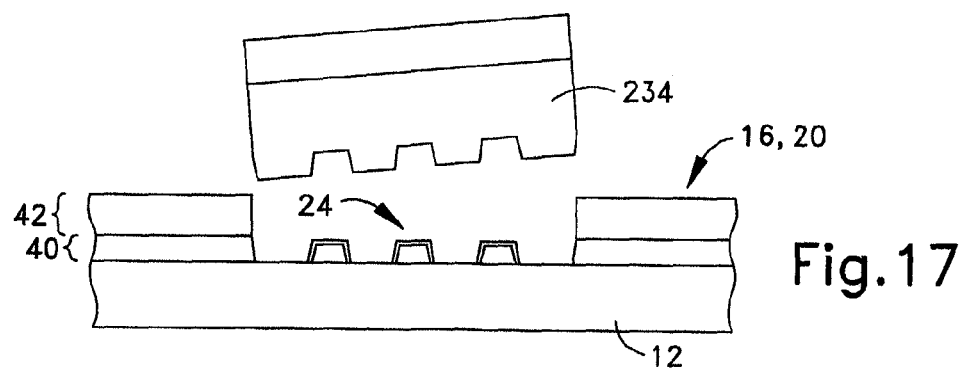
Figure 18:
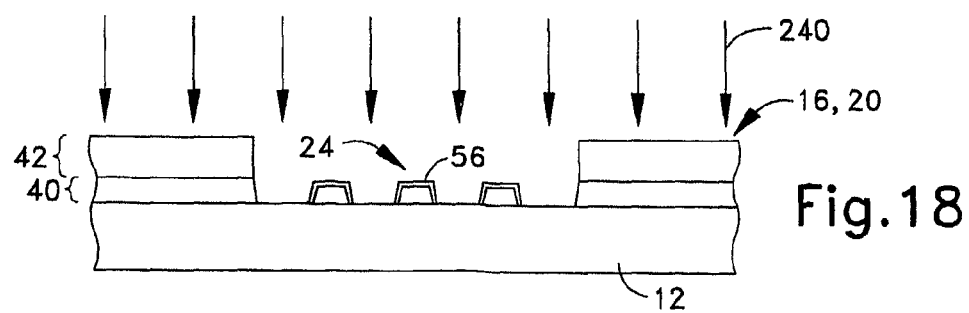

The removal of the remaining photoresist material 234 at step 128 is shown in FIG. 17. The trimming of the silicon dioxide of the top layer 56 by reactive ion etching 240 is shown in FIG. 18.

From the above description of the present invention, persons skilled in the art will perceive improvements, changes, and modifications. Such improvements, changes, and modifications within the skill of the art are intended to be covered by the appended claims.

The invention claimed is:

1. A piezoelectric surface acoustic wave device including a transducer electrode formed on a substrate, the electrode having a plurality of sequential layers, a first one of the layers being a metal and having a propensity to migrate in response to piezoelectric forces during operation of the device, a second one of the layers being an undesired destination of potential migration of the metal from the first layer, and a third one of the layers, which is located between the first and second layers, for providing a hardening effect to the first layer to inhibit the migration of the metal from the first layer to the second layer, wherein the third layer is a metal and oxygen compound.

2. A surface acoustic wave device as set forth in claim 1, wherein the metal and oxygen compound includes aluminum.

3. A surface acoustic wave device as set forth in claim 2, wherein the metal and oxygen compound is aluminum oxide.

4. A piezoelectric surface acoustic wave device including a transducer electrode formed on a substrate, the electrode having a plurality of sequential layers, a first one of the layers being a metal and having a propensity to migrate in response to piezoelectric forces during operation of the device, a second one of the layers being an undesired destination of potential migration of the metal from the first layer, and a third one of the layers, which is located between the first and second layers, for providing a hardening effect to the first layer to inhibit the migration of the metal from the first layer to the second layer, wherein the substrate is planar, each of the layers having a portion extending parallel to the substrate, the parallel extending portions being vertically stacked relative to the substrate, at least some of the layers also having portions extending transversely to the substrate, and the transverse extending portions being laterally stacked relative to the substrate.

5. A surface acoustic wave device as set forth in claim 4, wherein the third layer of hardening material has a portion extending laterally about the first layer of metal for preventing migration of the metal.

6. A surface acoustic wave device as set forth in claim 4, wherein the transverse portions do not extend onto the substrate beyond the electrode.

7. A surface acoustic wave device as set forth in claim 4, wherein the third layer is a metal and oxygen compound.

8. A surface acoustic wave device as set forth in claim 7, wherein the metal and oxygen compound includes aluminum.

9. A surface acoustic wave device as set forth in claim 8, wherein the metal and oxygen compound is aluminum oxide.

10. A surface acoustic wave device as set forth in claim 4, wherein the metal of the first layer includes aluminum.

11. A surface acoustic wave device as set forth in claim 1, wherein the transducer electrode is electrically connected to a metal component that permits electrical connection of the surface acoustic wave device to an electrical device external to the surface acoustic wave device, the electrode having a metal portion of a first metallization, and the component being of a second, different metallization.

12. A surface acoustic wave device as set forth in claim 11, wherein the component includes one of a bus bar and a bond pad.

13. A surface acoustic wave device as set forth in claim 11, wherein the first metallization includes the metal portion of the electrode being made of a first metal, and the second metallization includes the component being made of a second, different metal.

14. A surface acoustic wave device as set forth in claim 11, wherein the first metallization includes the metal portion of the electrode having a first thickness, and the second metallization includes the component having a second, different thickness.

15. A piezoelectric surface acoustic wave device including a transducer electrode formed on a substrate, the electrode having a plurality of sequential layers, a first one of the layers being metal that has a propensity to migrate toward a second of the layers, and a third layer, which is located between the first and second layers, being a metal and oxygen compound to inhibit the migration of the metal from the first layer.

16. A surface acoustic wave device as set forth in claim 15, wherein the metal and oxygen compound includes aluminum.

17. A surface acoustic wave device as set forth in claim 16, wherein the metal and oxygen compound is aluminum oxide.

18. A piezoelectric surface acoustic wave device including a transducer electrode formed on a substrate, the electrode electrically connected to a metal component that permits electrical connection of the surface acoustic wave device to an electrical device external to the surface acoustic wave device, the electrode having a metal portion layer of a first metallization, and the component being a layer of a second, different metallization, wherein the electrode has a plurality of sequential layers, a first one of the layers being metal and having a propensity to migrate in response to piezoelectric forces during operation of the device, a second one of the layers being an undesired destination of potential migration of the metal from the first layer, and a third one of the layers being a material for providing a hardening effect to the metal layer to inhibit the migration of the metal from the first layer to the second layer, wherein the substrate is planar, each of the layers having a portion extending parallel to the substrate, the parallel extending portions being vertically stacked relative to the substrate, at least some of the layers also having portions extending transversely to the substrate, and the transverse extending portions being laterally stacked relative to the substrate.

19. A surface acoustic wave device as set forth in claim 18, wherein the component includes one of a bus bar and a bond pad.

20. A surface acoustic wave device as set forth in claim 18, wherein the first metallization includes the metal portion of the electrode being made of a first metal, and the second metallization includes the component being made of a second, different metal.

21. A surface acoustic wave device as set forth in claim 18, wherein the first metallization includes the metal portion of the electrode having a first thickness, and the second metallization includes the component having a second, different thickness.

22. A surface acoustic wave device as set forth in claim 18, wherein the material is a metal and oxygen compound.

23. A surface acoustic wave device as set forth in claim 22, wherein the metal and oxygen compound includes aluminum.

24. A surface acoustic wave device as set forth in claim 23, wherein the metal and oxygen compound is aluminum oxide.

25. A surface acoustic wave device as set forth in claim 18, wherein the metal of the material includes aluminum.

26. A surface acoustic wave device as set forth in claim 18, wherein the second layer, of hardening material, has a portion extending laterally about the first layer, of metal, for preventing migration of the metal.

27. A surface acoustic wave device as set forth in claim 18, wherein the transverse portions do not extend onto the substrate beyond the electrode.

28. A surface acoustic wave device as set forth in claim 18, wherein the material is a metal and oxygen compound.

29. A surface acoustic wave device as set forth in claim 28, wherein the metal and oxygen compound includes aluminum.

30. A surface acoustic wave device as set forth in claim 29, wherein the metal and oxygen compound is aluminum oxide.

31. A surface acoustic wave device as set forth in claim 18, wherein the metal of the material includes aluminum.

* * * * *